United States Patent
Murakami et al.

(10) Patent No.: US 7,345,362 B2
(45) Date of Patent: Mar. 18, 2008

(54) ELECTRONIC COMPONENT AND METHOD FOR MANUFACTURING THE SAME

(75) Inventors: Kozo Murakami, Osaka (JP); Kunihiro Fujii, Osaka (JP); Satoshi Matsuo, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 139 days.

(21) Appl. No.: 10/932,893

(22) Filed: Sep. 2, 2004

(65) Prior Publication Data

US 2005/0036278 A1 Feb. 17, 2005

Related U.S. Application Data

(63) Continuation of application No. 09/856,822, filed as application No. PCT/JP00/06646 on Sep. 27, 2000, now Pat. No. 6,804,103.

(30) Foreign Application Priority Data

Sep. 28, 1999 (JP) ................. 11-274205
Sep. 29, 1999 (JP) ................. 11-275782

(51) Int. Cl.
H01L 23/48 (2006.01)
H01L 23/52 (2006.01)
H01L 23/552 (2006.01)
H01L 23/02 (2006.01)
H01L 29/22 (2006.01)
H01L 33/00 (2006.01)
H01L 23/12 (2006.01)

(52) U.S. Cl. ................ 257/690; 257/678; 257/660; 257/99; 257/704; 257/701

(58) Field of Classification Search ............... 257/99, 257/701, 704, 660, 678, 690
See application file for complete search history.

(56) References Cited

U.S. PATENT DOCUMENTS 5,124,927 A 6/1992 Hopewell et al.

(Continued)

FOREIGN PATENT DOCUMENTS

JP 57-8737 1/1982

(Continued)

OTHER PUBLICATIONS

International Search Report corresponding to application No. PCT/JP00/06646 dated Nov. 7, 2000.

(Continued)

*Primary Examiner*—Luan Thai
(74) *Attorney, Agent, or Firm*—RatnerPrestia

(57) ABSTRACT

An electronic component, in which a chip can be mounted on a certain predetermined place of the package at a high accuracy level, which package having a stepped level-difference in the inner wall of a cavity. The package is provided with a stepped level-difference in the inner wall surface, and an internal contact electrode formed on the upper surface of the stepped level-difference. At the bottom of the package is a shield electrode, on which a chip is mounted via an adhesion layer. The chip and the internal contact electrode are electrically connected by an interconnection wire. Location aligning for the chip and the interconnection wire, at least either one of these, is conducted by making use of a region, which is non-electrode portion, provided on the inner bottom surface of the package.

7 Claims, 6 Drawing Sheets

U.S. PATENT DOCUMENTS

| | | | |
|---|---|---|---|
| 5,422,717 A | | 6/1995 | Hattori et al. |
| 5,438,413 A | | 8/1995 | Mazor et al. |
| 5,635,670 A | | 6/1997 | Kubota et al. |
| 5,804,870 A | * | 9/1998 | Burns ..................... 257/666 |
| 6,144,090 A | | 11/2000 | Higashiguchi |
| 6,303,974 B1 | | 10/2001 | Irons et al. |
| 6,459,489 B1 | | 10/2002 | Farrell et al. |
| 6,462,818 B1 | | 10/2002 | Bareket |
| 6,680,528 B2 | | 1/2004 | Matsuo et al. |
| 6,847,460 B2 | | 1/2005 | Farrell et al. |
| 7,006,235 B2 | | 2/2006 | Levy et al. |
| 2003/0002043 A1 | | 1/2003 | Abdulhalim et al. |

FOREIGN PATENT DOCUMENTS

| | | |
|---|---|---|
| JP | 57-42138 | 3/1982 |
| JP | 64-332 | 1/1989 |
| JP | 1-123342 | 8/1989 |
| JP | 2-56446 | 4/1990 |
| JP | 4-213845 | 8/1992 |
| JP | 6-77265 | 3/1994 |
| JP | 6-104687 | 4/1994 |
| JP | 07-283684 | 10/1995 |
| JP | 07-321595 | 12/1995 |
| JP | 8-293756 | 11/1996 |
| JP | 09-026307 | 1/1997 |
| JP | 09-162691 | 6/1997 |
| JP | 09-229646 | 9/1997 |

OTHER PUBLICATIONS

Romdhani, et al., "A Generic Face Appearance Model of Shape and Texture Under Very Large Pose Variations from Profile to Profile Views," Harrow School of Computer Science, University of Westminster, Watford Rd., Northwick Park, Harrow, United Kingdom, 2000 IEEE, pp. 1060-1063.

Harasaki, et al., "Offset of coherent envelope position due to phase change on reflection," Applied Optics, vol. 40, No. 13, May 1, 2001, pp. 2102-2106.

Schmit, et al., "High precision interferometric shape measurement of objects with areas of different reflectance," Proceedings of SPIE, vol. 4275 (2001) pp. 85-93.

Feke, et al., "Interferometric back focal plane microellipsometry," Applied Optics, vol. 37, No. 10, Apr. 1, 1998, pp. 1796-1802.

Peter de Groot, "Optical properties of alumina titanium carbide sliders used in rigid disk drives," Applied Optics, vol. 37, No. 28, Oct. 1, 1998, 6654-6663.

Smallen, et al. "Pole Tip Recession Measurements on Thin Film Heads Using Optical Profilometry With Phase Correction and Atomic Force Microscopy," Transactions of the ASME, vol. 115, Jul. 1993, pp. 382-386.

\* cited by examiner

ELECTRONIC COMPONENT AND METHOD FOR MANUFACTURING THE SAME

This application is a Continuation of application Ser. No. 09/856,822, filed Aug. 27, 2001, now issued as U.S. Pat. No. 6,804,103 which is a National Phase Application of PCT International Application PCT/JP00/06646.

TECHNICAL FIELD

The present invention relates to a SAW (Surface Acoustic Wave) device or the like electronic component that houses electronic device chip in the package. The present invention relates also to a method for manufacturing the electronic components.

BACKGROUND ART

FIG. 5 shows a plan view of a conventional SAW device, while FIG. 6 shows the cross sectional view. As shown in these drawings, a conventional SAW device is manufactured by first stacking a first ceramic frame body 101 on one of the surfaces of a ceramic substrate 100, and a second ceramic frame body 102 on the first ceramic frame body 101, and these frame bodies together with the substrate are fired to form an integrated package 103. An internal contact electrode 104 and a shield electrode 105 are formed on certain predetermined areas of the package 103, and a seam ring 110 is provided on the upper-end surface of the package by means of silver brazing. And then, the internal contact electrode 104, the shield electrode 105 and the seam ring 110 are gold plated on the surface.

A SAW chip 107 is comprised of comb-formed electrodes for input/output formed on a piezoelectric substrate (not shown), and reflector electrodes and contact electrodes coupled with the comb-formed electrodes provided at both sides of the comb-formed electrode. The SAW chip 107 is mounted on the bottom surface of a cavity of the package 103; namely, it is mounted on the shield electrode 105 provided on the surface of ceramic substrate 100, with an adhesion layer 106 interposed in between. Next, a pattern recognition is conducted from above the package 103, namely from the seam ring 110 side towards the SAW chip 107, for detecting boundaries between the second ceramic frame body 102 and the first ceramic frame body 101, and between the internal contact electrode 104 and a non-internal contact electrode portion 108a,108b.

A location for bonding a wire 109 on the internal contact electrode 104 is determined based on the two boundaries detected through the above procedure as well as the dimensional particulars of the package 103.

In accordance with the location determined as above, the SAW chip 107 and the internal contact electrode 104 are interconnected by the wire 109, and then a lid 111 is welded on the seam ring 110 of package 103.

In the above-described conventional technology, however, it is extremely difficult to establish the location at a high accuracy level, because of a displacement which occurs when silver-brazing the seam ring 110.

If a location thus determined is not accurate enough, the wire 109, for example, could be connected erroneously with the shield electrode 105, or an defective connection between the wire 109 and the internal contact electrode 104 might arise.

The present invention aims to offer an electronic component, in which an electronic device chip can be aligned to a certain specific location at a high accuracy level and an accurate location is established at a high accuracy level for bonding a wire on the internal contact electrode. A method for manufacturing the electronic components is also offered by the present invention.

DISCLOSURE OF THE INVENTION

The outline structure of an electronic component of the present invention is that it is provided with a pattern suitable for aligning a SAW device chip or the like electronic device chip and an interconnection wire accurately to certain specified places of a package of the electronic component.

The outline of a method for manufacturing the electronic components of the present invention is that the package is provided with a stepped level-difference on the inner wall of cavity, and aligning of at least either said device chip or interconnection wire to a certain specified location is effected after detecting the boundary formed by the stepped level-difference and the inner bottom surface of said package at a high accuracy level.

Practically described, an electronic component of the present invention comprises a package, which having a cavity formed within and the cavity is provided with a stepped level-difference on the inner wall surface; an internal contact electrode provided on the upper end-surface of said stepped level-difference of the inner wall; a shield electrode provided on the inner bottom surface of said package; a device chip disposed on the shield electrode; and an interconnection wire for connecting the device chip with said internal contact electrode. Said inner bottom surface is provided with a non-electrode portion, which region is used for aligning at least either said device chip or said interconnection wire to a certain specific location. Said non-electrode portion can be used as a recognition pattern for aligning at least either the device chip or the interconnection wire to a certain specific location in the package. Since the non-electrode portion is different in color from the shield electrode formed on the inner bottom surface of the package, a place for mounting the device chip and a spot for bonding the interconnection wire on the internal contact electrode can be determined accurately by making use of the non-electrode portion.

Another electronic component of the present invention comprises a ceramic substrate; a first ceramic frame body formed on one of the surfaces of said ceramic substrate; a second ceramic frame body formed on said first ceramic frame body; stepped level-differences formed between said ceramic substrate and said first ceramic frame body and between said first ceramic frame body and said second ceramic frame body; an internal contact electrode formed on one of the surfaces of said first ceramic frame body, which surface being in the same side as a junction formed between said first ceramic frame body and said second ceramic frame body, which internal contact electrode extending over the side faces of said first ceramic frame body and said ceramic substrate as far as the other surface of said ceramic substrate; a shield electrode formed on the one surface of said ceramic substrate for having said device chip thereon, and said device chip is mounted on said shield electrode; and an interconnection wire for connecting said device chip with said internal contact electrode. The inner bottom surface of said package is provided with a non-electrode portion, which region is used for aligning at least either said device chip or said interconnection wire to a certain specific location. As already described above, the non-electrode portion may be considered as a recognition pattern for aligning at least either the device chip or the interconnection wire to a certain specific location. Thus a place for mounting the device chip and a spot for bonding the interconnection wire on the internal contact electrode can be determined at a high accuracy level.

Other features of the electronic component of the present invention include that it is provided with said non-electrode portion for at least two, said device chip is disposed on said shield electrode at an area that is specified by connecting said two non-electrode portions. When viewed from above the package, one of the sides of said non-electrode portion is coincidental with one of the sides of said internal contact electrode. Furthermore, one of the sides of said internal contact electrode, or the extension, is crossing substantially at a right angle with one of the sides of said non-electrode portion, or the extension. The clearance formed between the opposing inner walls of a package is greater at the lower stepped level-difference than at the upper stepped level-difference. In the electronic component of the present invention, a place for mounting the device chip and a spot for bonding the interconnection wire on the internal contact electrode can be determined at a higher accuracy level by taking advantage of the above-described features. In the electronic component of the present invention, the upper surfaces of the internal contact electrode and the device chip are disposed on substantially the same plane. With such configuration, both of the internal contact electrode and the device chip are brought into the focused zone together during the pattern recognition. This contributes to determining the bonding location of the interconnection wire on the internal contact electrode at a higher accuracy level.

Further, in the electronic component of the present invention, the length, in the direction from the internal contact electrode to the device chip, of a side of the non-electrode portion is greater than the focus displacement margin of a lens used for recognizing said boundary formed by the internal contact electrode and the non-electrode portion. With the above configuration, boundary between the internal contact electrode and the non-electrode portion can be recognized at a high precision level. Furthermore, a side of the non-electrode portion facing the internal contact electrode is longer than the gap between said internal contact electrodes. With the above configuration, boundary between the internal contact electrode and the shield electrode can be recognized at a high reliability level, even if there happens a displacement with the non-electrode portion.

A method for manufacturing the electronic components in accordance with the present invention comprises a first step for mounting a device chip in a package, which package having a cavity provided with stepped level-differences opposing to each other on the inner wall surface and a plurality of internal contact electrodes on the upper-end surface of said stepped level-difference; a second step for detecting a boundary formed by said stepped level-difference and the inner bottom surface of said package, as viewed from the above, for at least two, and determining spots for coupling said internal contact electrode with said device chip by means of the interconnection wire, based on results of the detection; a third step for electrically connecting said device chip with said internal contact electrode using said interconnection wire; and a fourth step for sealing said package with a lid at the opening. In accordance with the above-described method of manufacture, the internal contact electrode and the device chip can be connected reliably with the interconnection wire.

Further, in a method for manufacturing the electronic components in accordance with the present invention, the package of which having a shield electrode at the inner bottom surface and the inner bottom surface of the package, when viewed from the above, is provided with a non-electrode portion in a zone facing said stepped level-difference, a spot for bonding the interconnection wire is determined after detecting, in the first step, a boundary formed by said non-electrode portion and said stepped level-difference for at least two. In accordance with this method of manufacture, spots for bonding the interconnection wire on the internal contact electrode and the device chip can be determined more accurately.

A method for manufacturing the electronic components in accordance with the present invention, the package of which having a cavity provided with stepped level-differences opposing to each other on the inner wall surface and a plurality of internal contact electrodes on the upper-end surface of said stepped level-difference, comprises a first step for determining a place for mounting a device chip after detecting a boundary formed by said stepped level-difference and the inner bottom surface, as viewed from the above, for at least two; a second step for mounting said device chip in said package at the inner bottom; a third step for electrically interconnecting said device chip and said internal contact electrode with the interconnection wire; and a fourth step for sealing said package with a lid at the opening. In accordance with the above-described method of manufacture, a device chip can be mounted in a package at a high reliably level.

Furthermore, a method for manufacturing the electronic components in accordance with the present invention, whose package having a shield electrode formed on the inner bottom surface and provided with a non-electrode portion on said inner bottom surface at the end facing said internal contact electrode, determines a place for mounting a device chip, as viewed from the above in the first step, after detecting a cross point formed by one of the sides of said, or the extension, and one of the sides of said internal contact electrode, or the extension, for at least two. In accordance with the method, a device chip can be mounted in a package in a more reliable manner.

A method for manufacturing the electronic components in accordance with the present invention, whose package having a cavity provided with opposing stepped level-differences on the inner wall surface and provided internal contact electrode on the upper end-surface of said stepped level-difference, comprises a first step for determining a place for mounting the device chip in the package after detecting, as viewed from above the package, said boundary formed by the stepped level-difference and the inner bottom surface for at least two, a second step for mounting said device chip in said package, a third step for determining spots for interconnecting said internal contact electrode and said device chip with the interconnection wire after detecting, as viewed from above the package, said boundary formed by the stepped level-difference and the inner bottom surface for at least two, a fourth step for electrically interconnecting said device chip and said internal contact electrode with the interconnection wire, and a fifth step for sealing said package at the opening with a lid. In accordance with the above-described method of manufacture, a device chip can be mounted in a package and the device chip and the internal contact electrode can be interconnected with an interconnection wire at a higher reliability level.

Furthermore, in a method for manufacturing the electronic components in accordance with the present invention, the package of which having a shield electrode on the inner bottom surface and provided with a non-electrode portion on the inner bottom surface at a side facing the internal contact electrode, a place for mounting the device chip is determined after detecting, in the first step, a cross point formed by one of the sides of said non-electrode portion, or the extension, and one of the sides of said internal contact electrode, or the extension, for at least two, and spots for bonding the interconnection wire are determined, in the third step, after detecting a cross point formed by one of the sides of said non-electrode portion, or the extension, and one of the sides of said internal contact electrode, or the extension, for at least two. In accordance with the above-described method of manufacture, a device chip can be mounted in a package and the device chip and the internal contact electrode can be interconnected with an interconnection wire at a higher reliability level.

BEST MODE FOR CARRYING OUT THE INVENTION

Embodiment 1

Figure 1:
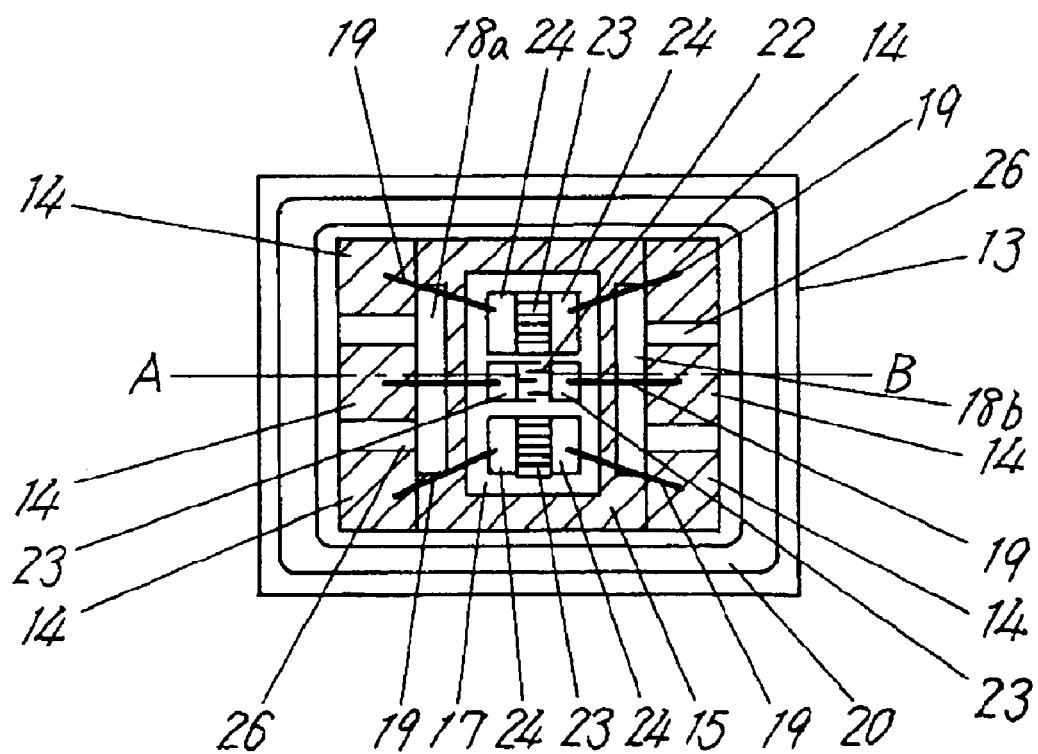
FIG. 1 is a plan view of a SAW device, in accordance with exemplary embodiments 1 through 3 of the present invention, before the package is sealed with a lid.
Figure 2:
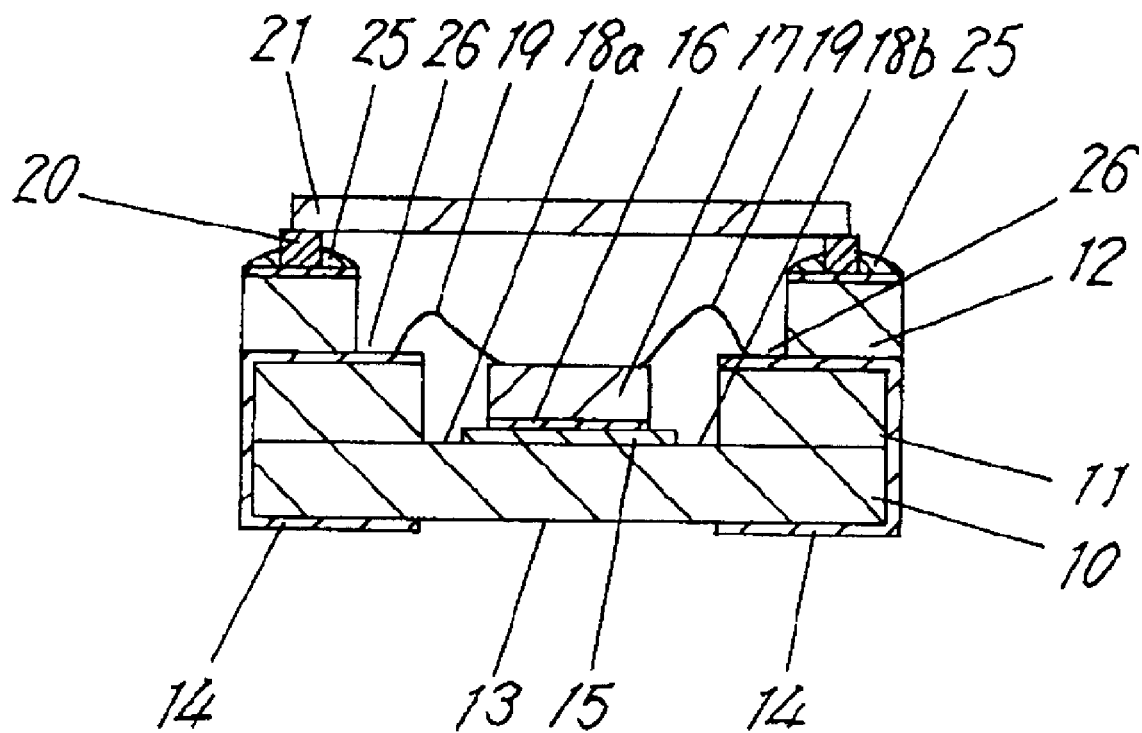
FIG. 2 is a cross sectional view of the SAW device, in accordance with exemplary embodiments 1 through 3.

FIG. 1 shows a SAW device in accordance with a first exemplary embodiment of the present invention, as viewed from the above, or the lid side, before it is sealed with a lid. FIG. 2 shows a cross sectional view of the SAW device of FIG. 1, sectioned at the line A-B.

The first embodiment of the present invention is described in the following with reference to the drawings. On one of the surfaces of a ceramic substrate 10, namely the surface on which a SAW chip 17 is mounted, a first ceramic frame body 11 and a second ceramic frame body 12 whose size being different from the first ceramic frame body 11, are stacked in the order to form a package 13, which package having a cavity provided with a stepped level-difference 26.

An internal contact electrode 14 is formed covering one of the surfaces of the first ceramic frame body 11 (upper surface), the side faces of the ceramic substrate 10 and the first ceramic frame body 11, and part of the other surface (bottom surface) of the ceramic substrate 10.

A shield electrode 15 is formed on the upper surface of the ceramic substrate 10, on which the SAW chip 17 is mounted via an adhesion layer 16. Non-electrode portion 18a, 18b are provided on the inner bottom surface of package 13 at the sides facing the stepped level-difference 26. The SAW chip 17 is disposed on said shield electrode at a certain area that is specified by connecting said two non-electrode portion 18a, 18b.

A first thing for manufacturing the electronic components of the present invention is to provide a plating under-layer on the upper surface, the bottom surface and the side face of ceramic substrate 10 in such areas where the shield electrode 15 and the internal contact electrode 14 are to be formed.

Next, on the upper surface of the ceramic substrate 10, a first ceramic frame body 11 is formed. The plating under-layer is provided also on the upper surface and the side face of the first ceramic frame body 11 for an area of the same shape as the internal contact electrode 14, which is to be formed later thereon.

And then, on the first ceramic frame body 11, a second ceramic frame body 12, which has the same dimensions in the outer circumference and narrower in the body width relative to those of the first ceramic frame body 11, is provided to create the stepped level-difference 26 inside the package 13. These are fired together to form an integrated package 13 consisting of the ceramic substrate 10, and the first and the second ceramic frame bodies 12, 13. The plating under-layer is provided also on the upper surface of the second ceramic frame body 12.

The ceramic substrate 10, the first ceramic frame body 11 and the second ceramic frame body 12 have been manufactured mainly of aluminum oxide, and the plating under-layer has been formed mainly of tungsten material.

The package 13 is plated with nickel over the plating under-layer, and a seam ring 20, thermal expansion coefficient of which being the same or identical to that of the package 13, is formed by means of silver brazing on the upper surface of the second ceramic frame body 12.

It undergoes nickel plating again, and then gold plating for forming the internal contact electrode 14 and the shield electrode 15.

As FIG. 1 illustrates, the internal contact electrode 14 is provided on each of the upper surface of the stepped level-differences 26 formed on the inner wall of package 13 (the upper surface of the first ceramic frame body 11) for a plurality of pieces extending as far as edge of the inner circumference; respective sides of the internal contact electrode being in parallel with respective sides of the package 13 (sides of the first ceramic frame body 11). Consequently, the internal contact electrode 14 assumes a substantially rectangular shape, or a square shape.

Also, respective sides of the non-electrode portion 18a, 18b provided on the inner bottom surface of package 13 are in parallel with respective sides of the package 13, and the region is reaching the bottom end of the first ceramic frame body 11 at the inner circumference. Namely, the region 18a, 18b assumes a substantially rectangular shape, or a square shape, with the internal contact electrode 14 and the region 18a, 18b being disposed in an arrangement substantially rectangular to each other.

Non-electrode portion 18a, 18b is provided for two at both sides of the SAW chip 17 so that it is disposed immediately next to the internal contact electrode 14, as viewed, in FIG. 2, from above the package 13, or from the seam ring 20 side towards the SAW chip 17.

A SAW chip 17 comprises comb-formed electrodes 22 for input/output formed on the substrate and a plurality of contact electrodes 24, which being coupled with the reflector electrode 23 and the comb-formed electrode 22, provided at both sides of the comb-formed electrode 22.

The SAW chip 17 is mounted on the shield electrode 15 of the package 13, with an adhesion layer 16 interposed in between. Contact electrode 24 of the SAW chip 17 is substantially on the same level as the internal contact electrode 14 in the height. As viewed from above the package 13, the non-electrode portion 18a, 18b is disposed between the internal contact electrode 14 and the contact electrode 24 of SAW chip 17.

The package 13 undergoes a pattern recognition procedure from the above. A point of boundary formed by the non-electrode portion 18a, 18b and the internal contact electrode 14 is detected at each of the opposing stepped level-differences 26, and the middle point is established on a straight line connecting the two points. Using the middle point as reference, and based on various dimensional particulars of the package 13, a spot for bonding the interconnection wire 19 on the internal contact electrode 14 is determined. Pattern of electrodes such as the comb-formed electrode 22, contact electrode 24, etc. formed on the surface of SAW chip 17, is also recognized, and, based on which, a spot for bonding the interconnection wire 19 on the contact electrode 24 is determined. And then, the interconnection wire 19 is bonded at one end on the internal contact electrode 14, while the other end on the contact electrode 24 of SAW chip 17, for electrical connection. A lid 21 is welded on a seam ring 20 provided around the upper surface of package 13 to have the SAW chip 17 sealed in the package 13.

Embodiment 2

Embodiment 2 relates to the procedure of determining a location for mounting a SAW chip 17, and the description is made with reference to FIG. 2. In the same way as in embodiment 1, a package 13 having an internal contact electrode 14 and a shield electrode 15, as well as a SAW chip 17, are prepared as the first step. The SAW chip 17 is mounted on the shield electrode 15 via an adhesion layer 16. A pattern recognition is conducted on the package 13 from the above to detect a cross point formed by the non-electrode portion 18a, 18b and the internal contact electrode 14. The middle point is established in a straight line connecting the corresponding two cross points. Using the middle point as reference, and based on various dimensional particulars of the package 13, a place for mounting a SAW chip 17 is determined.

In other words, the non-electrode portion 18a, 18b is provided for at least two, and a SAW chip 17 is placed somewhere in a straight line connecting the two. And the SAW chip 17 is mounted at the location on the shield electrode 15 of package 13 via an adhesion layer 16.

Next, after the contact electrode 24 of SAW chip 17 and the internal contact electrode 14 are connected using an interconnection wire 19, a lid 21 is welded on a seam ring 20 provided around the upper surface of package 13 to have the SAW chip 17 sealed in the package 13.

Embodiment 3

Embodiment 3 relates to the procedure of determining a place for bonding an interconnection wire 19 on an internal contact electrode 14. Description is made referring to FIG. 3; where, portions designated by the same numerals as in FIG. 1 represent that they perform the same functions respectively. In the following, only the points of difference from embodiment 1 are described. In embodiment 1, the is disposed immediately next to the internal contact electrodes 14, as viewed from above the package 13. However, in the present embodiment 3, the region 18a, 18b is not disposed at a place where it has an immediate contact with the internal contact electrodes 14.

Therefore, when a pattern recognizing procedure is conducted on the package 13 from the above, a cross point formed by the extension of a side of the non-electrode portion 18a, 18b, which side facing the stepped level-difference 26, and the extension of a side of the internal contact electrode 14, which side facing the inner bottom surface of package 13, is detected, and then the middle point is established in a straight line connecting the corresponding two cross points. Using the middle point as reference, and based on various dimensional particulars of the package 13, a spot for bonding the interconnection wire 19 on the internal contact electrode 14 is determined.

And then, the interconnection wire 19 at one end is bonded on the internal contact electrode 14, while the other end on the contact electrode 24 of SAW chip 17 for electrical connection.

A lid 21 is welded on the seam ring 20 provided around the upper surface of package 13 to have the SAW chip 17 sealed in the package 13.

Now in the following, points of significance with the present embodiment 3 are described.

(1) In the present embodiment, a pattern recognition procedure is applied on the package 13 from the above to detect a boundary point between the inner bottom surface of package 13 and the internal contact electrode 14, for determining a place for mounting the SAW chip 17 or a spot for bonding the interconnection wire 19 on the internal contact electrode 14. The reason for the above is as follows:

In order to reduce the possible recognition errors to a minimum, it is preferred to make a distance between recognition points as long as possible. In this point of view, a boundary point between the seam ring 20 and the first ceramic frame body 11, as viewed from above the package 13, may be detected. However, since the seam ring 20 is fixed on the upper surface of the second ceramic frame body 12 by means of silver brazing 25 the placement accuracy can easily be displaced. On the other hand, the amount of displacement is smaller with the first ceramic frame body 11, which is shaped through a punching process, as compared with that of seam ring 20.

Furthermore, besides the case where a package 13 is sealed by welding a lid 21 using the seam ring 20, the upper end-surface of the second ceramic frame body 12 needs to be provided with a plated layer even when it is sealed with solder. In this case, the accuracy in the shape is inferior to that of the first ceramic frame body 11. Therefore, it is preferred to use a boundary formed by the first ceramic frame body 11 and the inner bottom surface of package 13.

(2) Since the internal contact electrode 14 and the shield electrode 15 have been formed with the same gold plating, it is difficult for the pattern recognition conducted from above the package 13 to distinguish one from the other. When a non-electrode portion 18a, 18b is provided next to the internal contact electrode 14, the location aligning can be made at a higher accuracy level by taking advantage of a contrast generated by difference in the color between the two.

The non-electrode 18a, 18b may be provided instead in other layout arrangement, where corners of the region 18a, 18b and the internal contact electrode 14 are adjacent, as viewed from above the package 13 like in FIG. 1.

Embodiment 4

Figure 3:
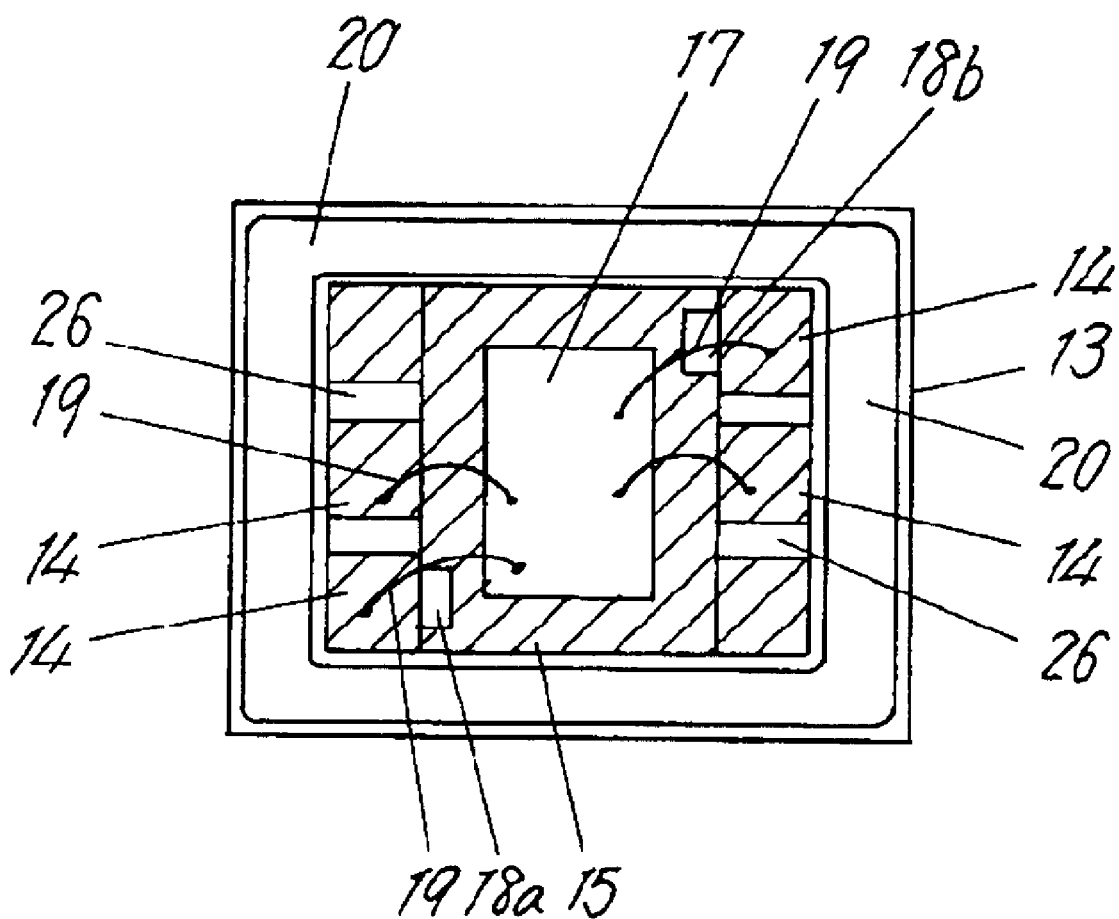
FIG. 3 is a plan view of a SAW device, in accordance with other exemplary embodiments of the present invention.

Embodiment 4 is described also referring to FIG. 3; where, portions designated by the same numerals as in FIG. 1 represent that they perform respectively the same functions as those described in embodiments 1 and 2. So, description of such portions are eliminated.

In the following, only the points of difference as compared with embodiments 1 and 2 are described. In embodiment 4, the non-electrode portion 18a, 18b is not disposed at a place where it has an immediate contact with the internal contact electrodes 14; like the layout of embodiment 3. However, one of the sides of the region 18a, 18b and one of the sides of the internal contact electrode 14 coincide on the boundary line formed by the stepped level-difference 26 and the inner bottom surface.

Therefore, a pattern recognition procedure is applied from above the package 13 for detecting, in each of the stepped level-differences 26 opposing to each other, a point at which the extension of one of the sides of the non-electrode portion 18a, 18b and the extension of the internal contact electrode 14's other side cross at a right angle. In a straight line connecting the two corresponding cross points, the middle point is established to be used as reference. Using the middle point, and based on various dimensional particulars of the package 13, a place for mounting the SAW chip 17 is determined.

Embodiment 5

Figure 4:
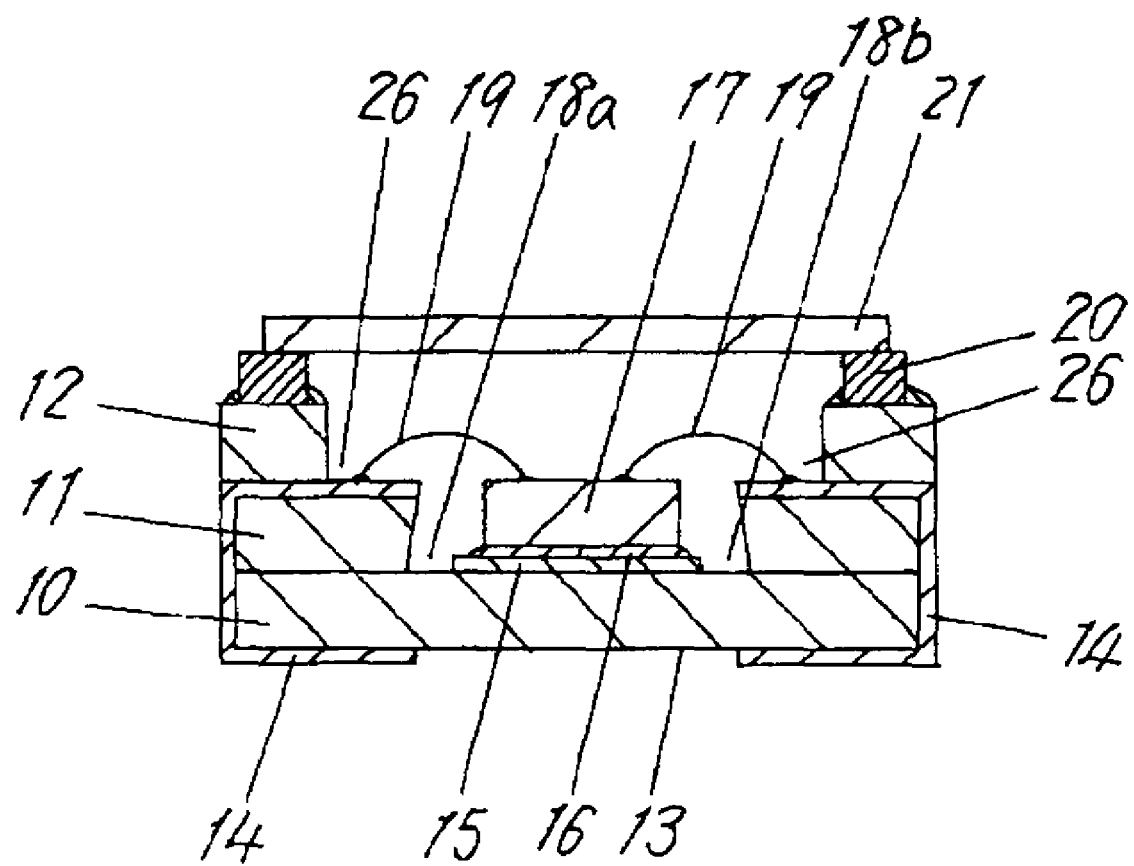
FIG. 4 is a cross sectional view of the SAW device, in accordance with the other exemplary embodiments.
Figure 5:
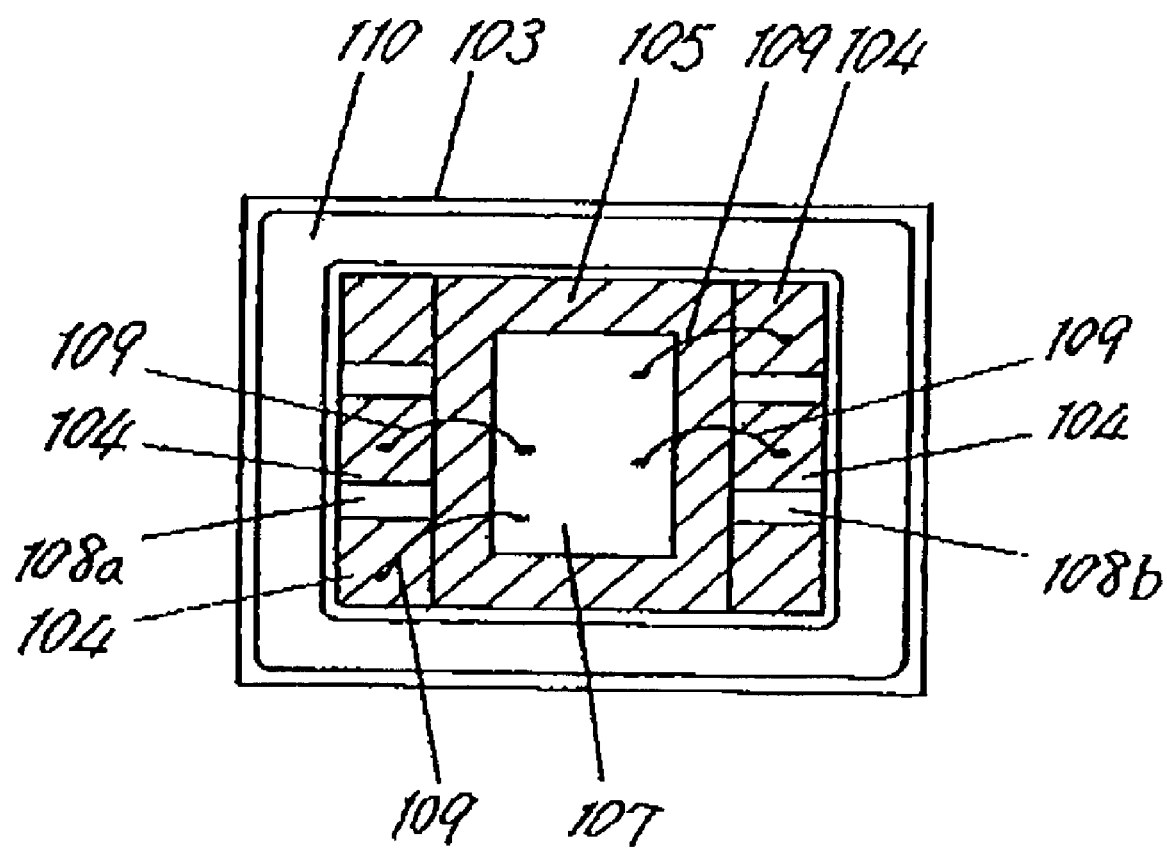
FIG. 5 is a plan view of a conventional SAW device, before it is sealed with a lid.
Figure 6:
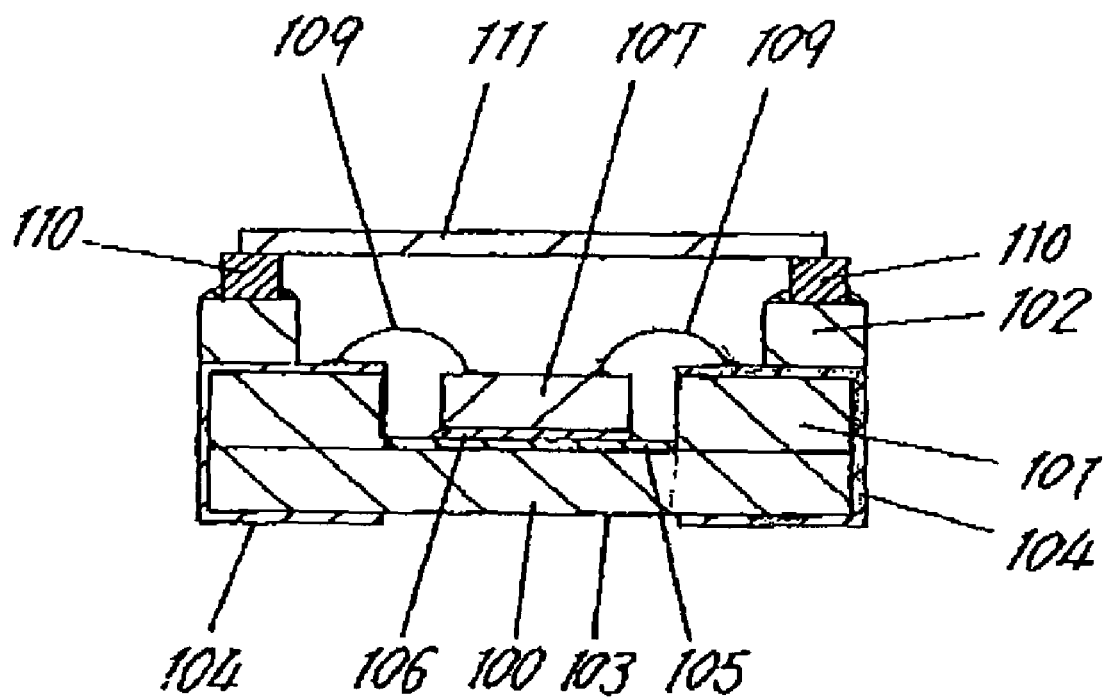
FIG. 6 is a cross sectional view of the conventional SAW device.

A point of significance with embodiment 5 is in the shape of a first ceramic frame body 11. The present embodiment 5 is described referring to FIG. 4; where, portions designated by the same numerals as in FIG. 1 represent that they perform respectively the same functions as those described in embodiment 1. So, detailed description of such portions are eliminated.

In the following, only the points of difference as compared with embodiment 1 are described. In the first ceramic frame body 11 in embodiment 1, the inner side wall and the upper surface cross to form a right angle; whereas, it is an acute angle in the present embodiment 5. Thereby, clearance between the opposing stepped level-differences 26 becomes greater in the lower part than in the upper part.

The first ceramic frame body 11 in embodiment 5 may be provided by first punching a ceramic sheet to a certain predetermined shape and then providing the inner side wall with a tapered form, for example. When the inner side wall and the upper surface of the ceramic frame body 11 form an acute angle, a rectangular cross point formed by one of the sides of the non-electrode portion 18a, 18b, or the extension, and one of the sides of the internal contact electrode 14, or the extension, can be detected at a higher accuracy level during a pattern recognition procedure conducted from above the package 13.

The same applies also to the SAW chip 17 in the earlier embodiments 2 through 4.

Now the points of significance in embodiments 1 through 5 are briefed as follows:

(1) In embodiments 1 and 3, it is recited that, as viewed from above the package 13, a rectangular cross point formed by one of the sides of the non-electrode portion 18a, 18b, or the extension, and one of the sides of the internal contact electrode 14, or the extension, is detected at a pattern recognition, and the contact electrode 24 of SAW chip 17 and the internal contact electrode 14 are reliably connected by means of interconnection wire 19.

In embodiments 2 and 4, it is recited that, prior to mounting a SAW chip 17 in the package 13, a rectangular cross point formed by one of the sides of the non-electrode portion 18a, 18b, or the extension, and one of the sides of the internal contact electrode 14, or the extension, is detected at a pattern recognition as viewed from above the package 13, for determining a place for mounting the SAW chip 17.

Thus, a place for mounting the SAW chip 17 and a spot for bonding the interconnection wire 19 on the internal contact electrode 14 can be specifically determined when the non-electrode portion 18a, 18b and the internal contact electrode 14 are disposed in an arrangement where, as viewed from above the package 13, one of the sides, or the extensions, of the above two forms cross at substantially a right angle. In manufacturing one SAW device, the pattern recognition may of course be conducted for twice; namely, for determining a place for mounting a SAW chip 17 and a point for bonding the interconnection wire 19 on the internal contact electrode 14.

(2) In embodiments 1 and 3, where the pattern recognition is conducted for determining a spot for bonding the interconnection wire 19 on the internal contact electrode 14, a non-electrode portion 18a, 18b whose width is broader than that of the focus shift margin of a lens used for the pattern recognition contributes to avoid possible recognition errors.

(3) In a configuration where the upper surfaces of SAW chip 17 and the internal contact electrode 14 are on substantially the same plane, both of the SAW chip 17 and the internal contact electrode 14 can be contained in a focused scope at the pattern recognition. Thus, the rectangular cross point formed by one of the sides of the non-electrode portion 18a, 18b, or the extension, and one of the sides of the internal contact electrode 14, or the extension, and electrode patterns on the SAW chip 17, such as contact electrodes, comb-formed electrodes, can be recognized at once.

(4) Furthermore, in embodiments 1 and 2, where a cross point formed by one of the sides of the non-electrode portion 18a, 18b and one of the sides of the internal contact electrode 14 is detected, a boundary between the package 13 and the inner bottom surface can be surely recognized. On the other hand, what is detected in embodiments 3 and 4 is a rectangular cross point formed by the extension of one of the sides of the non-electrode portion 18a, 18b and the extension of one of the sides of the internal contact electrode 14. Therefore, if there is a displacement taken place with the package 13, for example, the location recognition accuracy in embodiments 3 and 4 may become slightly inferior to that in embodiments 1 and 2.

Therefore, it is preferred to dispose the non-electrode portion 18a, 18b to be adjacent, as viewed from above the package 13, to the internal contact electrode 14, like in embodiments 1 and 2. In order to avoid a possible consequence that may result from a slightly displaced formation of the region 18a, 18b, it is preferred to form the region 18a, 18b so that the length of a side facing the internal contact electrode 14 is greater than the value of a clearance between the internal contact electrodes 14 formed on the same stepped level-difference 26.

(5) The point of significance with embodiment 5 is in the shape of a first ceramic frame body 11. Namely, the inner side-wall and the upper surface of the first ceramic frame body 11 form an acute angle. Thereby, distance between the opposing stepped level-differences 26 becomes greater in the lower section than in the upper section. With this configuration, a rectangular cross point formed by one of the sides of the non-electrode portion 18a, 18b, or the extension, and one of the sides of the internal contact electrode 14, or the extension, can detected at a high accuracy level in a pattern recognition conducted from above the package 13. The above-described configuration with the ceramic frame body 11 may be introduced in all the embodiments 1 through 4.

(6) The non-electrode portion 18a, 18b has been provided, in the above-described embodiments, facing each of the opposing stepped level-differences 26. Instead, the above two regions 18a, 18b may be provided altogether in a side facing one of the stepped level differences 26 for detecting a rectangular cross point formed by one of the sides of the non-electrode portion 18a, 18b, or the extension, and one of the sides of the internal contact electrode 14, or the extension, for the purpose of location aligning. In order to recognize the point at a higher accuracy level, it is preferred to provide the non-electrode portion 18a, 18b at both sides of a SAW chip 17 disposed on the bottom of the package 13.

(7) A boundary, as viewed from above the package 13, between the stepped level-difference 26 and the bottom surface can be recognized in accordance with the present invention at a high accuracy level for determining a location of mounting a SAW chip 17. As a result, the inside dimensions of the package 13 can be reduced to a minimum required for mounting a SAW chip 17 therein. Thus the present invention offers a compact SAW device.

Among the devices of the present invention, a shield electrode 15 of greater area provides the greater shielding effects. Further, the non-electrode portion 18a, 18b may be provided for three or more; however, two such regions are sufficient for determining a place for mounting the SAW chip 17.

Although the above exemplary embodiments have been described using a SAW device as an example, the present invention offers the same advantage also to such other electronic component containing a chip within the package which is provided with electrodes on the upper surface and the bottom surface.

INDUSTRIAL APPLICABILITY

In accordance with the present invention, such electronic components can be made available in which a spot for bonding the interconnection wire on the internal contact electrode is determined at a high accuracy level. A method for manufacturing the electronic components is also contained in the present invention.

What is claimed is:

1. An electronic component configured for mounting a chip comprising:
    a package having an inner wall formed circumferentially around the package with a stepped level-difference in the inner wall, the stepped level-difference including upper and lower portions;
    a plurality of internal contact electrodes provided on an upper end-surface of said stepped level-difference in the inner wall;
    a shield electrode provided on an inner bottom surface of said package at a side facing said stepped level-difference;
    a non-electrode portion defined to be adjacent to the shield electrode where the shield electrode is not formed and the non-electrode portion being provided on a part of the inner bottom surface of said package; and
    an interconnection wire for connecting said chip and a respective internal contact electrode of the plurality of internal contact electrodes; wherein
    the lower portion of the stepped level-difference and the inner bottom surface form a cavity with an aperture such that a clearance between opposing sides of the lower portion of the stepped level-difference is greater at the inner bottom surface than at the aperture of the cavity.

2. An electronic component comprising:
    a ceramic substrate;
    a first ceramic frame body formed on one of the surfaces of said ceramic substrate;
    a second ceramic frame body formed on said first ceramic frame body;
    steps formed by said ceramic substrate and said first ceramic frame body and by said first ceramic frame body and said second ceramic frame body;
    an internal contact electrode formed on a main surface of said first ceramic frame body at the same side as a junction formed by said first ceramic frame body and said second ceramic frame body; and
    a chip mounted on the one surface of said ceramic substrate; wherein:
    a shield electrode is provided on the one surface of said ceramic substrate to define a boundary,
    a non-electrode portion is defined to be adjacent to the shield electrode where the shield electrode is not formed and the non-electrode portion is provided on a part of the inner bottom surface of said package; and
    an inner side of the first ceramic frame body and the main surface of said first ceramic frame body cross to form an acute angle such that the first ceramic frame body is tapered to provide greater clearance between the chip and the inner side of the first ceramic frame body nearer to the ceramic substrate than further from the ceramic substrate.

3. The electronic component of claim 1, wherein one side of said non-electrode portion and one side of said internal contact electrode substantially coincide on a straight line.

4. The electronic component of claim 2, wherein one side of said internal contact electrode and one side of said non-electrode portion cross at substantially a right angle, as viewed from above said electronic component.

5. The electronic component of claim 1, wherein one side of one of said internal contact electrodes and one side of said non-electrode portion cross at substantially a right angle, as viewed from above said electronic component.

6. The electronic component of claim 1, wherein a part of said non-electrode portion is in contact with a part of said stepped level-difference.

7. The electronic component of claim 1, wherein the non-electrode portion and the plurality of internal contact electrodes have different optical characteristics such that the plurality of internal contact electrodes and the non-electrode portion define a visible boundary, as viewed from above said electronic component, for placement of the chip.

* * * * *